US008787827B2

United States Patent
Voskulen et al.

(10) Patent No.: US 8,787,827 B2
(45) Date of Patent: Jul. 22, 2014

(54) GAIN CONTROL AND FREQUENCY STABILITY IN DIGITALLY-CHANNELISED RF BI-DIRECTIONAL AMPLIFIERS

(75) Inventors: Lambertus Anthony M. Voskulen, Belair (AU); Zheng Li, Tranmere (AU); Mykola Kyrylenko, Lockleys (AU); Michael Leigh Beard, Clovelly Park (AU); Jack Zaprianov Grozev, North Adelaide (AU)

(73) Assignee: RF Industries Pty Ltd, North Rocks, NSW (AU)

( * ) Notice: Subject to any disclaimer, the term of this patent is extended or adjusted under 35 U.S.C. 154(b) by 843 days.

(21) Appl. No.: 12/908,910

(22) Filed: Oct. 21, 2010

(65) Prior Publication Data

US 2011/0103434 A1   May 5, 2011

(30) Foreign Application Priority Data

Oct. 29, 2009   (AU) ................................ 2009905291

(51) Int. Cl.
*H04B 7/15*   (2006.01)
(52) U.S. Cl.
USPC .......... 455/11.1; 455/20; 455/127.2; 455/136
(58) Field of Classification Search
USPC ............... 455/11.1, 20, 13.1, 13.4, 22, 127.2, 455/136, 138, 219, 245.1, 240.1, 232.1; 370/252; 375/214
See application file for complete search history.

(56) References Cited

U.S. PATENT DOCUMENTS

| | | | |
|---|---|---|---|
| 6,009,324 A * | 12/1999 | Pravitz et al. | 455/423 |
| 2006/0025072 A1 * | 2/2006 | Pan | 455/11.1 |
| 2008/0039012 A1 * | 2/2008 | McKay et al. | 455/11.1 |

* cited by examiner

*Primary Examiner* — John J Lee
(74) *Attorney, Agent, or Firm* — Faegre Baker Daniels LLP

(57) ABSTRACT

Improved gain control for a digital signal processing (DSP) repeater, such as a bi-directional repeater, is disclosed. A repeater includes a back-end subsystem which comprises, for each channel in a set of wanted frequency channels that are amplified by the repeater, a coupler (314) arranged to provide a monitor signal corresponding with an output channel power level. A feedback loop (306) receives the monitoring signal, and incorporates a power control circuit (308) that compares the monitored output channel power level with a predetermined maximum output signal level (310). A corresponding control signal is generated, and provided to a variable attenuator (304) in order to maintain the individual output channel power level at or below the maximum output signal level (310). Advantageously, a DSP output level control function (404) is also provided, which maintains the output signal level of each digital channel below a maximum rated value for a digital-to-analogue converter (402). It is also advantageous to provide a front-end subsystem (420) including a variable gain attenuator (424) that is controlled by a signal (430) generated by a digital processing element (428) that monitors an output of an analogue-to-digital converter (426), in order to maintain an IF signal level at the analogue-to-digital converter input below a predetermined threshold value. An improved frequency stability control apparatus (600) and method (800) are also disclosed.

15 Claims, 7 Drawing Sheets

GAIN CONTROL AND FREQUENCY STABILITY IN DIGITALLY-CHANNELISED RF BI-DIRECTIONAL AMPLIFIERS

FIELD OF THE INVENTION

The present invention relates generally to the field of communications. More specifically, the present invention relates to repeaters used in communication and transmission systems, for example a bi-directional cellular communication system.

BACKGROUND TO THE INVENTION

Bi-directional amplifiers (BDA's), or repeaters, are commonly used for in-fill coverage or range extension in land mobile radio (LMR) networks. Typically, a BDA will receive a signal from a donor base station transmitter, boost the signal level, and retransmit the signal to mobile receivers lying within a designated area that would otherwise have weak or non-existent direct coverage from the donor base station transmitter. This sequence is commonly referred to as signal boosting in the "downlink" path. Conversely, a BDA will receive a signal from a mobile transmitter within the designated area, boost the signal level, and retransmit the signal back to the donor base station receiver (commonly referred to as the "uplink" path). Typical examples of the use of BDA's are to provide radio coverage into vehicular tunnels, underground car parks, shopping centres, or coverage extension along a motorway through a daisy chain of BDA's.

There are standards that govern the use of RF spectrum by all radio transmitting and receiving devices. These standards are established and mandated generally by government agencies that are chartered to ensure that the spectrum is allocated and used appropriately. Radio devices must conform to these standards in order to minimise both spectral pollution caused by spurious emissions, and interference to spectrum users.

The implication, as far as BDA's are concerned, are that the devices need to be channelized in order to meet relevant criteria within the standards. Simple broadband BDA's can only be employed in underground sites, where adverse spectral impact is mitigated by the ground's RF absorption, and so the usefulness of these devices is limited.

Channelizing is typically achieved by conversion of the input RF frequency to an intermediate frequency (IF) using standard mixing techniques, then filtering this IF signal at the wanted channel frequency (typically at 12.5 kHz or 25 kHz channel spacing), followed by conversion back to an RF frequency for subsequent re-transmission. Typically, the channel filters in this instance are analogue crystal or SAW filters, and the input and output RF frequencies are either identical (non-translating mode) or different (translating mode).

The technological advancements in semiconductor devices that have occurred over the past few years have led to high speed digital devices that can be used to process signals at frequencies of 100 MHz or more. Given that typical radio communication networks that operate on frequencies ranging from 60 MHz to 5.8 GHz for example, may be mixed to intermediate frequencies of say around 100 MHz, means that these devices may now be adapted for use in radio communication infrastructure products.

Digital signal processing devices that are now available, such as analogue to digital converters (ADC's), Field Programmable Gate Arrays (FPGA's) and digital to analogue converters (DAC's) are examples of the advancements that have been made. ADC's can now operate with clock speeds that enable direct analogue to digital conversion of RF signals at 100 MHz, say, and have 16 bit resolution which provides outstanding dynamic range. Equally, FPGA's and DAC's are available to complement the performance of the ADC's.

As a consequence, channelized BDA's for use in LMR networks, wherein the channelizing filters are implemented in the digital domain using well established filter implementation techniques, are now readily available. FIG. 1 is a typical example of one such configuration 100.

The arrangement in FIG. 1 shows a simplified block diagram 100 of an arrangement whereby a single digital signal processing (DSP) block 102 is configured as a downlink repeater to provide eight separate channelized outputs 104a-104h (wanted channels) from one input. While FIG. 1 includes elements embodying the present invention, as described in the following detailed description, the general architecture is similar to existing DSP-based repeaters. The input consists of a single ADC 106 fed from an IF stage 108. A second, identical arrangement (not shown), is provided to implement uplink (i.e. bi-directional) signal boosting.

These DSP-based BDA's (repeaters) will hereinafter be referred to as DSPbR's.

Typically, BDA's have input filters 110 to restrict the incoming RF signals to suit the band of interest. In general, these filters have a relatively large pass bandwidth (20 MHz, for example), therefore all of the input circuitry in BDA's, prior to the channelizing filters, will be subjected to a multitude of channel frequencies lying within the input filter bandwidth, across a range of input signal levels. In uplink, in particular, mobile transmitters may be close to the BDA, where input signal levels could well exceed −20 dBm, or they could be far away from the BDA where the input signal level could be as low as −110 dBm. This represents a minimum dynamic range of 90 dB that must be handled by the BDA.

BDA maximum power output levels may be of the order of +45 dBm, and maximum gain through the BDA may be of the order of 130 dB, meaning that as soon as input levels reach −85 dBm, gain control is required to keep the output level constant as the input level increases. This control mechanism is needed to ensure that the output stages are not overdriven beyond maximum rated output power, which would otherwise cause spurious emissions.

In DSPbR's, particular attention needs to be paid to ensuring that the ADC input does not exceed its rated full scale input voltage which would otherwise cause clipping and subsequent RF spurious emissions. Furthermore, the ADC could also be damaged by high input voltages. Similarly, input levels to the DAC's eg 112, need to be kept below that required to obtain rated full scale DAC output in order to avoid similar output spurii or device failure. The control of input signal levels, and therefore signal amplification (gain) at various stages within the DSPbR circuitry, is crucial for device protection and controlling spectral pollution.

This presents challenges, particularly in the uplink direction due to the dynamic range of the possible input signal levels, since any gain reduction or attenuation of high level input signals prior to the ADC input will have the effect of reducing the sensitivity of the DSPbR. That is, there exists the very real possibility that two wanted signals are present at the input of the DSPbR, one at a very low level that is just above the sensitivity threshold of the DSPbR, and one at a high enough level such that attenuation (net gain reduction) is required; remembering that this attenuation is common to all incoming signals the end result is that the signal level of the low level wanted signal is reduced as well thereby rendering it indiscernible from noise, and as a consequence, the signal is lost.

Clearly, the gain control circuitry must address all of these issues in such a way that spurious emissions are kept within regulatory limits, and that the sensitivity of the DSPbR is not unnecessarily impacted leading to compromises in performance.

The individual channel frequencies of the DSPbR are specified by user requirements. It is critical that the DSPbR only boosts the programmed channels, which in turn means that it must only respond to programmed channel frequencies, and that its boosted, filtered output must also fall directly on the programmed channel frequency. As mentioned previously, input and boosted output channel frequencies may be the same (non-translating mode), or different (translating mode), depending on user requirements.

Interference to other spectrum users will occur if the DSPbR does not faithfully respond to or output the exact programmed channel frequencies. That is, the frequency stability of the DSPbR is a critical specification and must be tightly controlled to minimize this interference.

The frequency stability of the DSPbR is determined by the stability of the frequencies of the local oscillators (LO's), eg 114, 116, that are used in the mixing processes to convert from RF to IF and then back to RF again, and by the stability of the numerically controlled oscillators (NCO's) in the digital processing circuitry which ultimately determine the centre frequency of the channelizing filters.

FIG. 1 shows a typical arrangement used to achieve this stability. The LO's, eg 114, 116 and NCO's (within DSP 102, not shown) are controlled by a reference generation subsystem 118 which numerically relates the LO and NCO frequencies to a known, stable reference frequency. A 10 MHz reference frequency is generated by a voltage-controlled, temperature-compensated crystal oscillator in the DSPbR for this purpose. This provides typical frequency stability of +/−1 ppm over a wide temperature range, which at 400 MHz for example, equates to +/−400 Hz. This has the effect of offsetting the channelizing filters by this amount which in turn has consequences in terms of unwanted spectrum emissions.

Better frequency stability over temperature variations can only be achieved by locking the 10 MHz reference frequency to an external, high stability master reference frequency. A perfect source of this master reference frequency is the highly accurate timing reference pulse extracted from the Global Positioning System (GPS) satellites via a GPS receiver 120. The reference generation subsystem in the DSPbR uses the GPS timing reference as the master reference frequency to further stabilize its internally generated 10 MHz reference frequency.

Under certain circumstances, the GPS master reference may not be available in which case the internally generated 10 MHz reference may drift giving rise to spectrum interference.

For example, in the event of a power failure, and subsequent restoration of power, the GPS receiver may take up to several minutes to acquire the satellites and establish a locked state.

In some cases, the DSPbR may be installed in a location where the visible sky aperture is limited (such as a valley) meaning that only a small number of satellites are in view at any point in time. Under these circumstances, the GPS receiver may temporarily lose satellites as they orbit and move out of the sky aperture, and re-acquire only as other satellites pass by.

Clearly, a method of maintaining the DSPbR's frequency stability in the absence of the GPS master reference is needed.

SUMMARY OF THE INVENTION

In a first aspect, the present invention provides a method for use in a repeater, for controlling gain of a plurality of distant frequency channels, comprising the steps of:

translating said channels from an input radio frequency (RF) band to a first intermediate frequency (IF) band;

converting the IF band into a corresponding digital signal comprising all of said channels;

processing the digital signal to select a set of wanted channels from the distinct frequency channels;

converting said set of wanted channels into corresponding analogue signals within a second IF band; and translating the signals in the second IF band to an output RF band, wherein the method further comprises, for each channel in the set of wanted channels:

monitoring an output channel power level;

comparing the monitored output channel power level with a predetermined maximum output signal level; and applying attenuation to the channel to maintain the output channel power level at or below the maximum output signal level.

Advantageously, the method monitors each wanted channel individually, and applies attenuation on a channel-by-channel basis in order to maintain the output channel power level at or below a maximum output signal level. As a result, attenuation applied to any individual channel has no effect on any of the other wanted channels. For example, a signal received from a mobile transmitter located in close proximity to the repeater may be a high-power signal requiring attenuation. This attenuation will not affect a low-power signal in a different wanted channel, received from a more-distant mobile transmitter, and therefore will avoid unnecessary degradation of the signal-to-noise ratio in the low-power channel.

In preferred embodiments, the same IF band may be used in receiving and transmitting the RF signals. That is, the first IF band may comprise the same frequency range as the second IF band. Advantageously, this may enable the same oscillator to be used to drive the mixers converting the input RF band to the first IF band and the second IF band to the output RF band.

In the embodiments of the invention, the method further comprises, for each wanted channel of the digital signal, monitoring a digital signal level to be input to a digital-to-analogue converter (DAC) having a maximum rate of output signal level, comparing the monitored digital signal level with a value corresponding with the maximum rated output signal level for the DAC, and digitally controlling a gain of the channel to maintain the digital signal level input to the DAC at or below the value corresponding with the maximum rated output signal level for the DAC.

Advantageously, this second gain control mechanism provided in embodiments of the invention ensures that individual wanted channel outputs do not overdrive a corresponding DAC, in order to avoid clipping distortion.

Further benefits may be obtained in embodiments of the invention by monitoring an IF power level of the IF band, comparing the monitored IF power level with a predetermined threshold level, and applying attenuation to the IF band to maintain the IF power level at or below the predetermined threshold level.

Advantageously, this third gain control mechanism provided in embodiments of the invention controls input power levels in order to avoid saturation and/or damage to sensitive components within a repeater, such as an input analogue-to-digital converter (ADC) of a digital signal processing subsection.

In another aspect, the present invention provides a method, for use in a repeater, for maintaining frequency stability of a reference oscillator subject to temperature variation, the method comprising:

providing a stable external frequency reference source having at least intermittent availability;

continuously monitoring a current temperature of the reference oscillator;

while the external frequency reference is available, applying a frequency control signal such that an output of the reference oscillator is synchronised to the external frequency reference, and recording a corresponding control signal value in association with the current temperature of the reference oscillator; and in the event that the external frequency reference is unavailable, applying a frequency control signal to the reference oscillator corresponding with a control signal value previously recorded in association with the current temperature of the reference oscillator.

In embodiments of the invention, the stable external frequency reference source may be a Global Positioning System (GPS) reference signal.

Advantageously, this frequency control mechanism may provide a 100-fold improvement in the frequency stability of the reference oscillator as compared with using a temperature-compensated crystal oscillator alone.

In embodiments of the invention, the gain control methods may be combined with the frequency stability method in order to provide a repeater having advantageous gain and frequency stability characteristics.

In a further aspect the invention provides a radio repeater for amplification of a plurality of distinct frequency channels, and configured to control channel gain, comprising:

a front-end subsystem including a mixer arranged to translate said channels from an input radio frequency (RF) band to a first intermediate (IF) band;

a digital signal processing sub-section including at least one analogue-to-digital converter (ADC) for converting the IF band into a corresponding digital signal comprising all of said channels, the digital signal processing sub-section being configured to process the digital signal to select a set of wanted channels from the distinct frequency channels, and further including a digital-to-analogue converter (DAC) to convert said set of wanted channels into corresponding analogue signals within a second IF band; and a back-end subsystem including a plurality of mixers arranged to translate the signals in the second IF band to an output RF band, wherein the back-end subsystem further comprises, for each channel in the set of wanted channels:

a coupler arranged to provide a monitor signal corresponding with an output channel power level;

a feedback loop arranged to receive said monitoring signal, and including a power control circuit for comparing the monitored output channel power level with a predetermined maximum output signal level, and to generate a corresponding control signal; and a variable attenuator arranged to receive the control signal, and to apply attenuation to the channel in order to maintain the output channel power level at or below the maximum output signal level.

In yet another aspect, the present invention provides a frequency reference generator comprising:

a receiver configured to receive an external frequency reference source signal having at least intermittent availability;

a voltage-controlled oscillator (VCO) having a nominal frequency corresponding with a desired reference frequency, and a control voltage input;

a correlator, configured to compare an external frequency reference derived from the external frequency reference source signal with corresponding samples of the VCO output frequency, and to generate an error-correction signal corresponding with a different frequency;

a temperature sensor, environmentally coupled to the VCO in order to measure the VCO temperature;

a memory device, configured to record error-correction signal values in association with corresponding temperature values detected by the temperature sensor; and a controller having a control signal output coupled to the VCO control voltage input, the controller being configured to:

while the external frequency reference source signal is available, generating a control signal determined such that an output of the reference oscillator is synchronised to the external frequency reference source signal, such that the error-correction signal is substantially zero; and in the event that the external frequency reference source signal is unavailable, retrieving from the memory device a previously recorded control signal value corresponding with a current temperature detected by the temperature sensor.

BRIEF DESCRIPTION OF THE DRAWINGS

Preferred embodiments of the present invention will now be described with reference to the accompanying drawings, in which.

DESCRIPTION OF PREFERRED
EMBODIMENTS

Gain Control in the DSPbR

Figure 2:
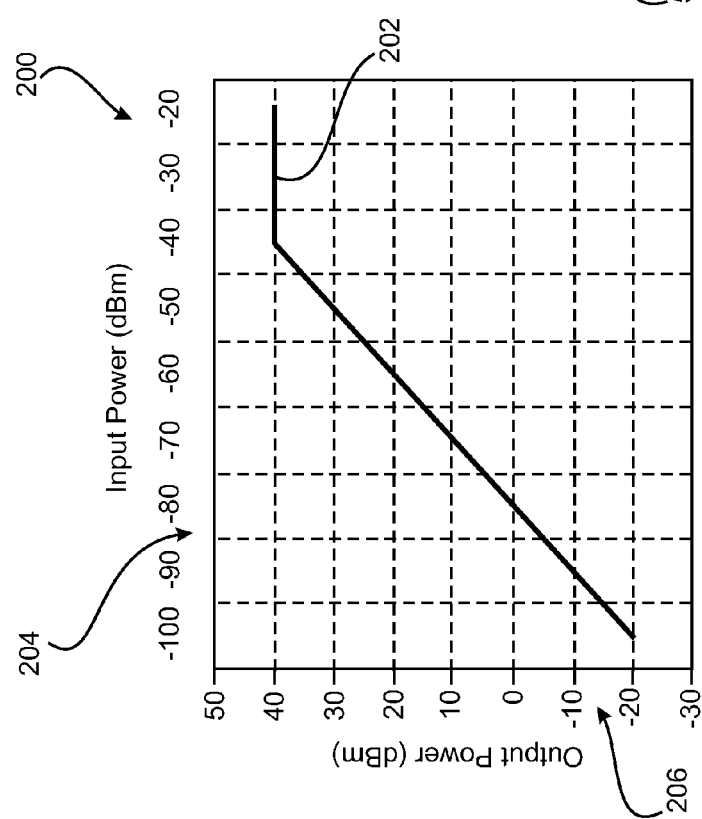
FIG. 2 is a graph illustrating the relationship between input power and output power for a DSP-based repeater.

Consider the operation of a single, wanted channel in either uplink or downlink paths. The DSPbR operates with constant gain until the specified maximum signal output power level is reached. That is, the signal output level is equal to the signal input level plus the gain of the DSPbR, up until such point that the maximum output level is reached. FIG. 2 is a graph 200 illustrating a typical relationship 202 between input 204 and output 206 power for a DSPbR set to have a maximum signal output power level of +40 dBm and a gain of 80 dB.

In typical DSPbR's the gain is configurable in a conventional manner, eg via RS232 and modem, with the added options of USB and Ethernet interfaces. The DSP subsystem 102 (DSPSS) adjusts the gain of each of the eight independent wanted channels, as well as implementing the channelizing filtering for each channel. The DSPSS 102 is capable of providing gain adjustment from between 35 dB to 130 dB per channel. This control function is mirrored in both the uplink and downlink paths.

In embodiments of the present invention the RF front-end and back-end subsystems (FESS and BESS respectively) have preset fixed gain, with provision for calibration through a 1 dB resolution variable-gain attenuator (VGA) which provides attenuation of input signal levels. This ensures that all FESS and BESS modules have the same gain, which will allow swapping of faulty modules, with no effect on individual channel settings. These features are described in greater detail below, with reference to FIGS. 3 and 4.

The DSPbR employs three separate mechanisms to control input and output signal levels, namely: back-end level control; DSP output level control; and an over-range input limiter. Each of these will now be described in turn.

Back-End Level Control

Figure 3:
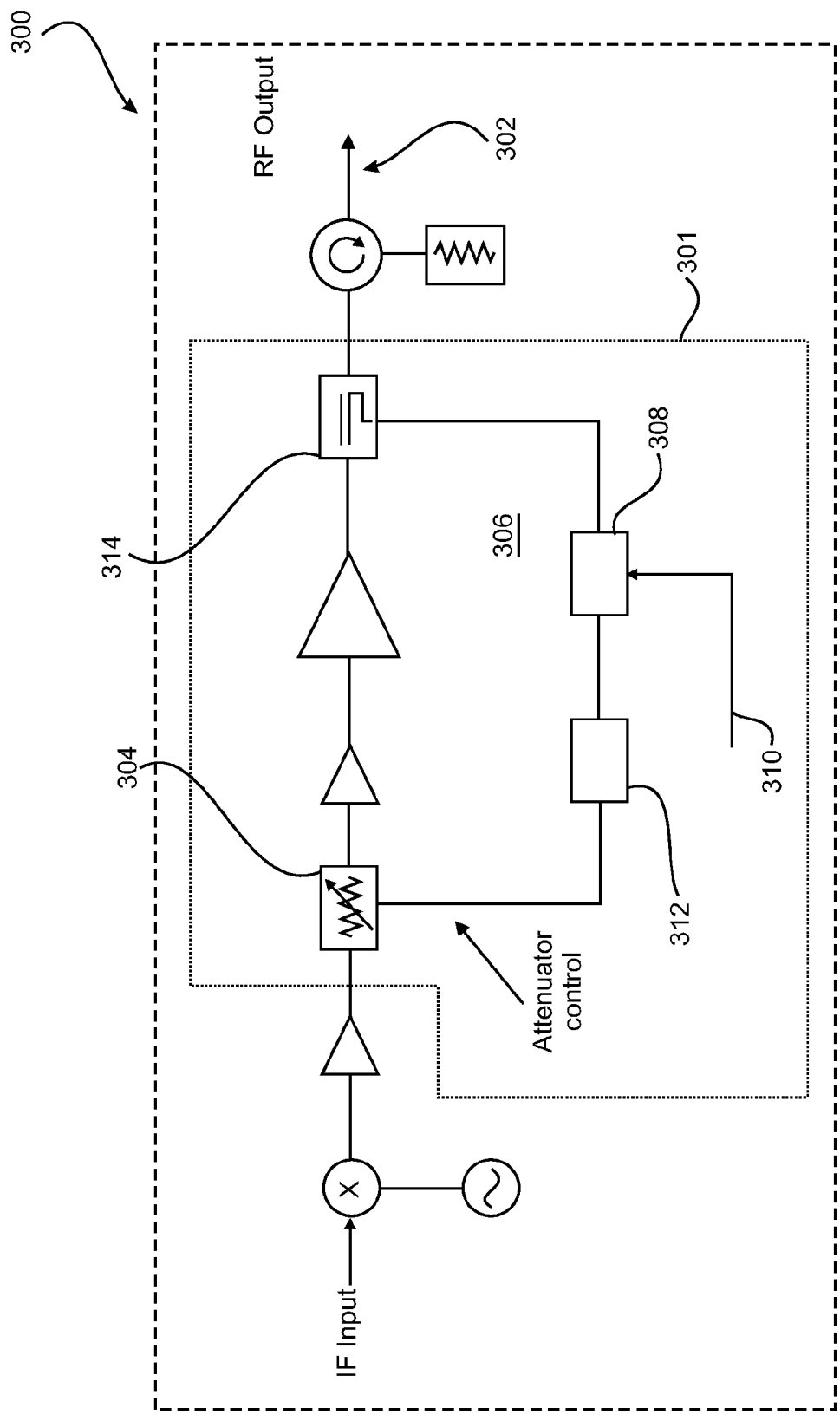
FIG. 3 is a schematic representation of a back end subsystem in accordance with a preferred embodiment of the present invention.

Back-end level control is provided to control the output signal levels of the DSPbR, and is the first of the three operational gain control mechanisms to react as input signal levels increase from the nominal sensitivity threshold values. Referring to FIG. 3, this control system is implemented in hardware within the BESS 300. A local controller 301 associated with each channel output ensures that the maximum rated output signal level of the BESS 300 is not exceeded, which would otherwise cause spurious emissions and possible device failures.

Consider a wanted signal level gradually rising from a threshold sensitivity of, say, −120 dBm. As the input signal level at the DSPbR rises, the output signal level (at the output 302 of the BESS 300) tracks the input signal level such that the output signal level is equal to the input signal level plus the gain of the DSPbR. Upon reaching the maximum rated output signal level, the VGA 304 at the input of the BESS begins to attenuate the input signal level to the BESS such that further increases of the wanted input signal level to the DSPbR are offset by the attenuation of the VGA 304. This ensures that the output signal level of the BESS 300 remains fixed at its maximum rated output signal level.

The VGA 304 is controlled via a feedback loop 306 comprising a power controller 308 for setting the desired output power according to control input 310, and a loop filter 312. Feedback input to the power controller is provided by a decoupler 314.

It is important to note that this control mechanism is occurring within the wanted channel's BESS 300. Since each of the wanted channels possess their own BESS 300, any such gain control in any individual BESS 300 only affects its own wanted channel signal level. Therefore, there is no performance degradation to other wanted channels whilst this control mechanism is at work on a particular wanted channel. Furthermore, since the gain control is being applied well beyond initial FESS and DSPSS gain blocks, the impact on the wanted channel's sensitivity is insignificant thereby maintaining excellent dynamic range over this control range.

DSP Output Level Control

DSP output level control is provided to prevent overdriving the wanted channel DAC's with signal levels exceeding that required for rated full scale DAC output, which would otherwise cause spurious emissions and possible device failures. This control mechanism is the second of the three operational gain control mechanisms to react as input signal levels increase from the nominal sensitivity threshold values.

Figure 4:
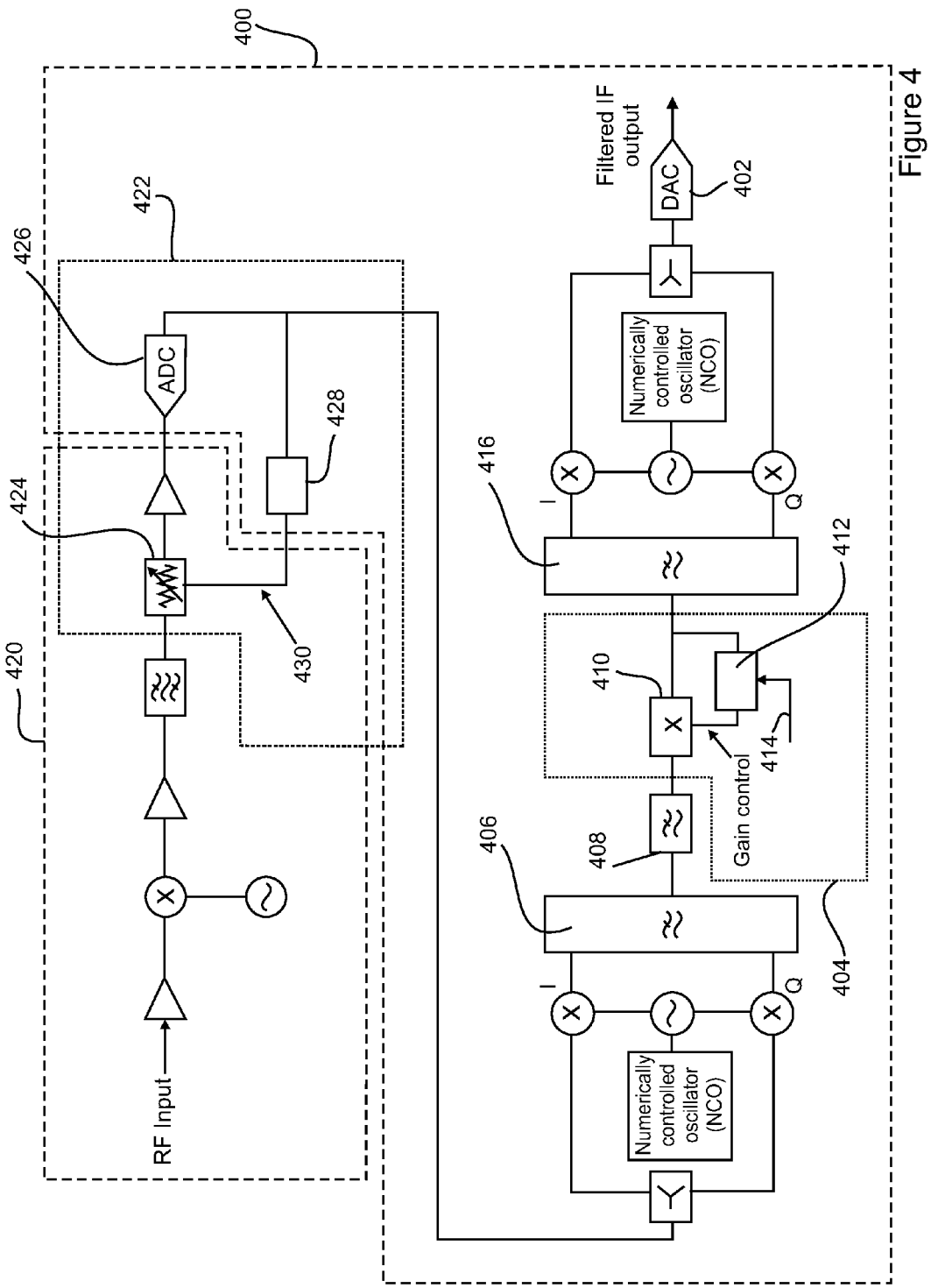
FIG. 4 is a schematic representation of a front end subsystem and DSP subsystem in accordance with a preferred embodiment of the present invention.

Referring now to FIG. 4, this mechanism is controlled solely by the DSPSS 400, which monitors the digital signal levels present at the inputs of each of the wanted channel DAC's 402, and limits the output level of the DAC's to approximately 2 dB below rated full scale DAC output—typically 0 dBm.

Consider a wanted signal level gradually rising from a threshold sensitivity of, say, −120 dBm. As the input signal level at the DSPbR rises, the digital input signal level at the wanted channel's DAC 402 tracks the DSPbR input signal level such that the DAC's input signal level is equal to the DSPbR input signal level plus 30 dB (approximate gain of the DSPbR at this point). Upon reaching the maximum rated DAC output signal level, the DSPSS begins to reduce the gain of the wanted channel within the DSP circuitry so that further increases of the wanted input signal level to the DSPbR are offset by the gain reduction within the DSP circuitry. This ensures that the output signal level of the DAC remains fixed at its maximum rated output signal level.

In particular, a DSP output level control block 404 is implemented following the cascaded integrator comb (CIC) filter and decimator 406, and finite impulse response (FIR) filter 408 that are used to select a wanted channel. A digital gain element 410 (ie variable multiplexer) is controlled via a peak level detector and gain control 412, which operates based on the gain element output and a desired gain control input 414. A CIC interpolator 416 then upsamples the signal for conversion by the DAC 402.

It is important to note that this control mechanism is occurring within the wanted channel's DSP circuitry or programming—that is, following the wanted channel's digital channelizing filter. Since each of the wanted channels possesses identical but independent DSP circuitry at this point, any such gain control in any individual DSP channel circuit only affects its own wanted channel signal level. Therefore, there is no performance degradation to other wanted channels whilst this control mechanism is at work on a particular wanted channel. Furthermore, there is still significant gain in the preceding FESS gain block 420 to ensure that the impact on the wanted channel's sensitivity is minimized, thereby ensuring that the dynamic range is only marginally compromised.

Figure 1:
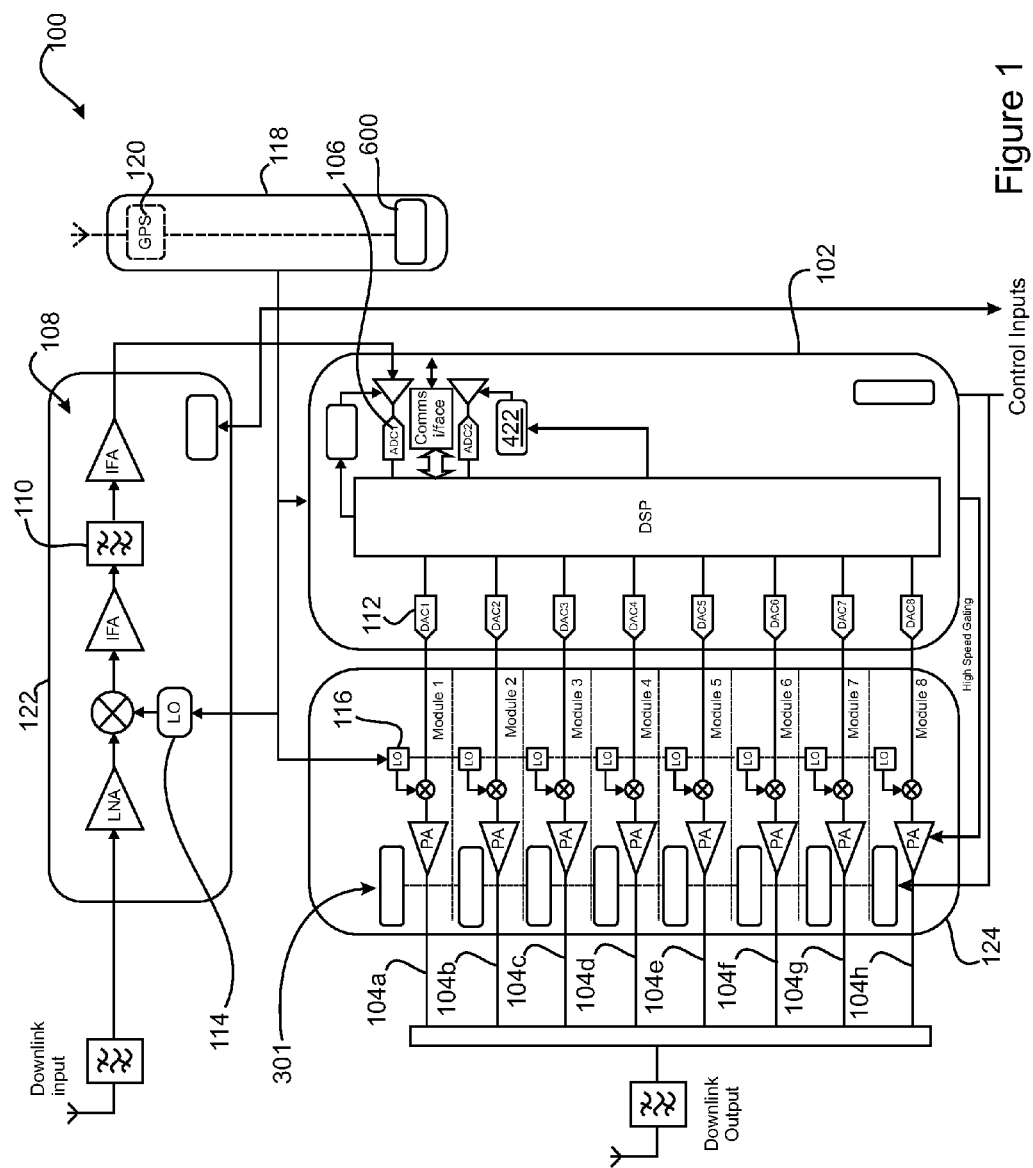
FIG. 1 illustrates a simplified block diagram of an 8-channel DSP-based downlink repeater embodying the invention.
Figure 5:
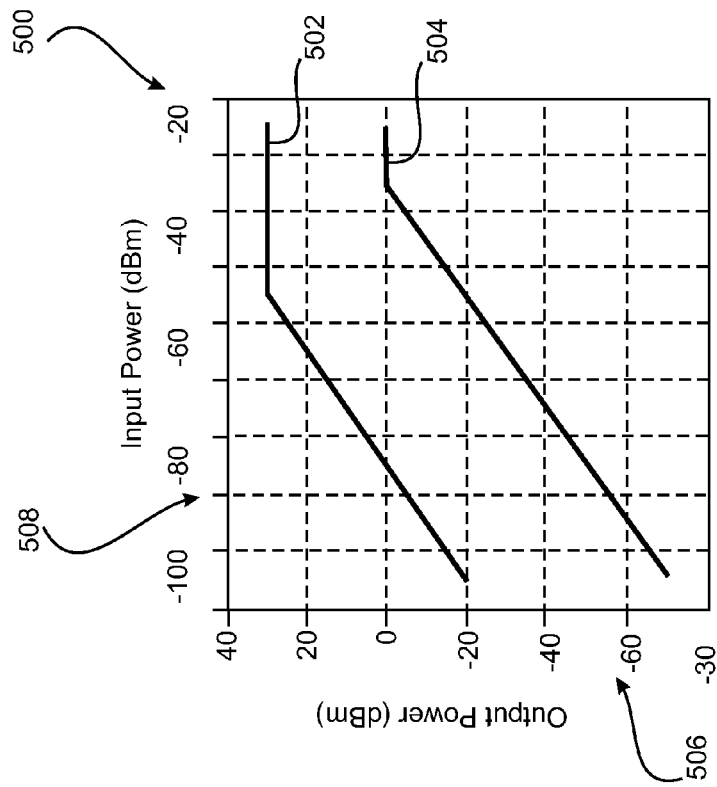
FIG. 5 is a graph illustrating the relationship between input power and output power in the back end subsystem and DSP system in a DSP-based repeater.

The Back-End and DSP Output level control mechanisms will continue to provide the sole means of gain control within the DSPbR up until such time that the wanted input signal level reaches −20 dBm, typically. FIG. 5 is a graph showing the behaviour of the Back-End 502 and DSP 504 Output level control mechanisms by observing the change in output signal levels 506 as the DSPbR's wanted input signal level 508 rises. In this example, the DSPbR is set to have a maximum signal output power level of +30 dBm and a gain of 80 dB.

Over Range Input Limiter (ORIL)

The primary function of over range input limiter (ORIL) 422 is to ensure that the input signal levels present at the ADC do not exceed its rated full scale input voltage which would otherwise cause spurious emissions and possible device failure. Furthermore, the ORIL also includes a protection system to avoid damaging the VGA 424 and ADC 426 when an extremely high level signal is applied to the DSPbR. This control mechanism is the last of the three operational gain control mechanisms to react as input signal levels increase from the nominal sensitivity threshold values.

The DSPbR monitors the signal output level from the FESS 420 at the input to the DSPSS 400. When a high level incoming signal (on either a wanted channel or an unwanted channel) produces a FESS output level which approaches the point where the ADC 426 will begin to clip (typically −20 dBm input level), the DSPbR begins reducing the gain of the VGA 424 in the FESS 420, which effectively attenuates all input signals appearing at the input to the FESS 420, including wanted and unwanted channel signals.

When this situation occurs, the DSPSS 400 compensates for the attenuation introduced by the VGA 424 by increasing the individual gain of each affected wanted channel within its individual DSP circuitry by the same amount, thereby keeping the net wanted channel gains constant. This gain adjustment of course does not apply to the high level incoming signal's channel should this happen to be one of the wanted channels.

In particular, an ADC output sampler 428 monitors the digital output of the ADC 426 to determine when it is reaching a clipping level, and generates a control signal 430 to the VGA 424. The ADC output sampler 428 is implemented as circuitry and/or programming within the DSPSS 400.

Of course, whilst this gain control maintains the overall net wanted channel gain constant, the sensitivity of the DSPbR on all of the wanted channels is diminished since the signal to noise ratio at the DSPbR is degraded by the amount of attenuation in the VGA 424. Therefore, the ORIL mechanism is included to protect the DSPbR from damage, to control spurious emissions, and to ensure the DSPbR will still operate with extremely high-level input signals, albeit with reduced sensitivity. This graceful degradation of sensitivity will typically start as input signal levels rise above −20 dBm. The ORIL mechanism may offer a further, final level of protection in that if the input signal level reaches +10 dBm, a switch (not shown) in the FESS 420 may be activated, adding a further 30 dB of attenuation of all incoming signal levels prior to the VGA 424.

Advantageously the DSPbR three-stage gain control mechanism ensures that spurious emissions are kept within regulatory limits and that the potential for device failure due to high incoming signal levels is diminished. The gain controls are implemented in such a way that the individual wanted channel sensitivities and output signal power levels are not unnecessarily impacted thereby minimising any compromises in performance.

Frequency Stability in the DSPbR

Figure 6:
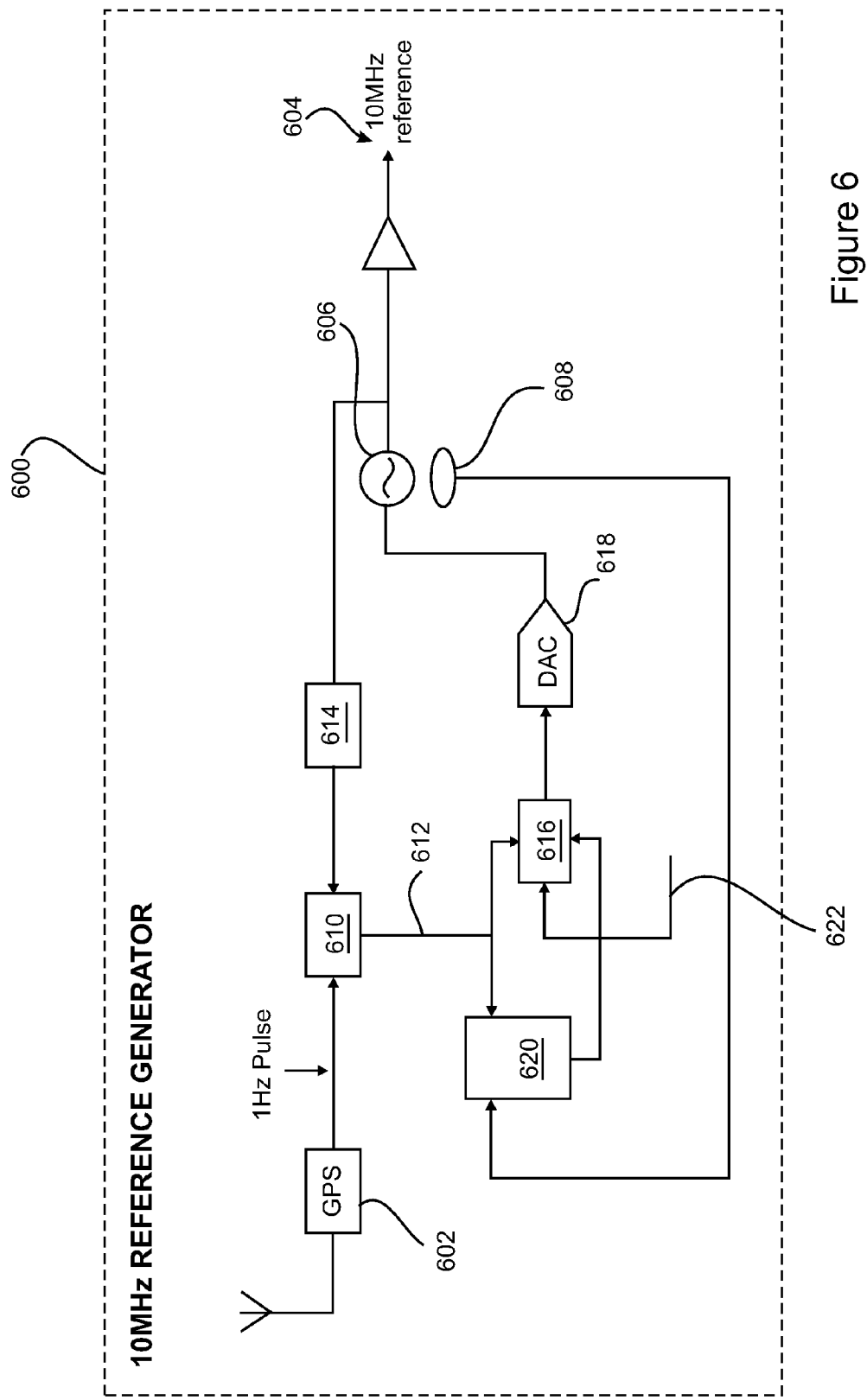
FIG. 6 is a schematic representation of a reference frequency generator in accordance with a preferred embodiment of the present invention.

Referring to FIG. 6, the reference generation subsystem 600 in the DSPbR utilises a timing reference pulse output from a GPS receiver 602 as a master frequency reference to stabilise its internally generated 10 MHz reference frequency 604. Whilst the GPS reference is present, the frequency stability of the DSPbR is guaranteed over a wide range of temperatures. Hence, the possibility of spurious emissions or spectrum interference due to misaligned channelizing filters or inaccurate frequency conversions is eliminated as a result. As mentioned previously, however, there exists the possibility that the GPS reference may not be available during certain time blocks so a method of maintaining the DSPbR's frequency stability in the absence of the GPS reference is needed.

The key parameter that sets the internally generated 10 MHz reference frequency in the DSPbR is the control voltage that is applied to the temperature-compensated crystal oscillator 606. The voltage that is required to maintain the oscillator output at exactly 10 MHz will vary with temperature, and as explained previously, albeit that the oscillator 606 has extremely good temperature stability characteristics, the extent of frequency variation over temperature is still significant in terms of the possibility of the DSPbR creating adverse spectral emissions in the absence of the GPS reference signal.

In order to overcome this scenario, the DSPbR, whilst receiving and remaining locked to the GPS master reference 602, is programmed to "learn" the control voltages that are required at different temperatures to keep the temperature-compensated crystal oscillator 606 locked to the GPS master reference 602. Specifically during normal operation a correlator 610 generates an error signal 612 based on a frequency difference between the GPS reference 602 and the output of the oscillator 606, divided to nominally one hertz by sampler 614. The error signal is applied to controller 616, which adjusts the oscillator frequency using a control signal output from DAC 618.

At the same time, temperature sensor 608 monitors the temperature of the oscillator, and a table is populated with entries comprising corresponding values of temperature and error signal 612.

Over time, a table of error signal values at different temperatures is established. This table keeps dynamically refreshing itself whilst the DSPbR is operational and locked to the GPS master reference signal.

In the event that the GPS master reference 602 is unavailable, a selection input 622 to the controller 616 is switched to a "fall back" mode, in which the controller extrapolates the correct control voltage relative to the temperature of the compensated crystal oscillator from the table of values 620 that it has acquired over time. This voltage is then applied to the temperature-compensated crystal oscillator.

This method of controlling the frequency stability over temperature variations, in the absence of the GPS master reference, improves the frequency stability characteristics of the DSPbR compared to that of the temperature-compensated crystal oscillator alone by a factor of 100, typically. That is, once the DSPbR temperature lookup table 620 has had sufficient time to be populated by the GPS master reference, over a range of temperatures, the frequency stability characteristics of the DSPbR, in the absence of a GPS master reference 602, are typically better than +/−0.01 ppm.

Thus, this method of enhancing the frequency stability of the DSPbR in the absence of the GPS-derived master reference frequency ensures that adverse spectral impact, resulting from misaligned channelizing filters or inaccurate frequency conversions in the RF/IF/RF mixing stages, is eliminated.

Figure 7:
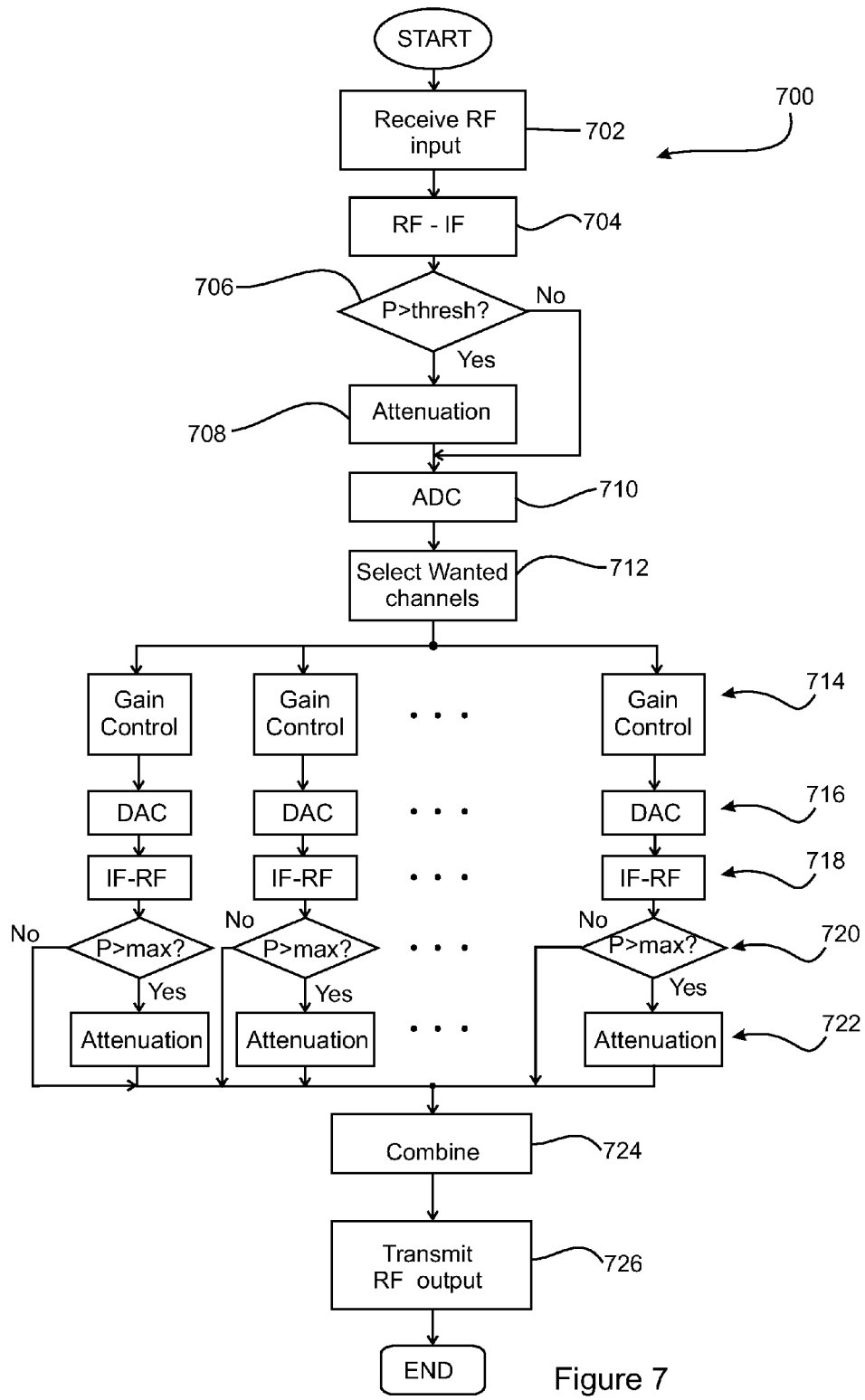
FIG. 7 is a flowchart illustrating a method of gain control according to an embodiment of the invention.
Figure 8:
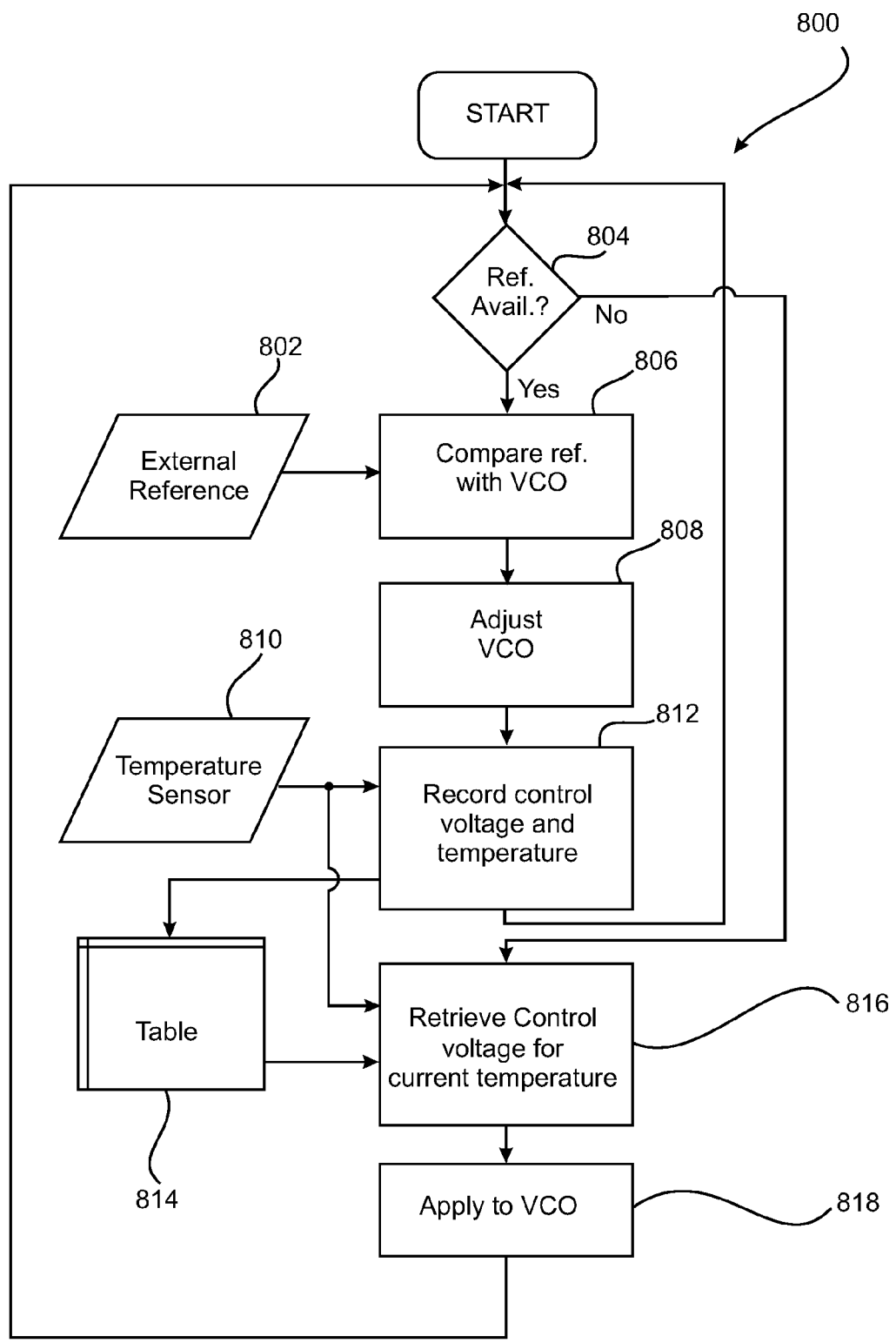
FIG. 8 is a flowchart illustrating a method of frequency stabilisation according to an embodiment of the invention.

FIGS. 7 and 8 are flowcharts illustrating the gain control and frequency stabilization methods, respectively, according to embodiments of the invention.

Considering firstly the flowchart 700, representing the gain control methods, an RF signal input within an RF frequency band is received at step 702. At step 704 the RF band is converted to a first IF band. The steps 706, 708 correspond with the ORIL function, and at step 706 a comparison is performed to determine whether a monitored IF power level exceeds a predetermined threshold level. If so, then at step 708 attenuation is applied to the IF band to maintain the IF power level at or below the predetermined threshold level.

At step 710, the IF signal is converted to a corresponding digital signal comprising all of the distinct frequency channels. Parallel processing of a plurality of wanted channels is performed in the replicated steps 714, 716, 718, 720 and 722.

In particular, for each distinct channel the DSP output level control is performed via digital processing at step 714. At step 716 the resulting wanted signals (subject to any other processing steps required, and not shown in the flowchart 700) is converted back to a corresponding analogue IF signal. At step 718 the IF signal is converted to a corresponding RF signal band.

The back-end level control function is performed at steps 720 and 722. In particular, step 720 comprises a comparison to determine whether the RF signal power exceeds a predetermined maximum output signal level. If so, then the individual channel is attenuated at step 722. Accordingly, each individual output channel power level is maintained at or below the maximum output signal level.

At step 724 the RF signals are recombined, and at step 726 they are transmitted.

Turning now to the flowchart 800, a frequency stability control method is illustrated. The block 802 represents the external reference input signal, such as a GPS receiver reference signal. As has been discussed above, the external reference signal may be available, or unavailable, depending upon current operating conditions. Accordingly, at step 804 a check is conducted to determine whether the reference signal is available. If so, control passes to step 806, in which a comparison is performed between the local oscillator frequency and the external reference frequency, in order to generate an appropriate error control signal. At step 808, this control signal is applied to adjust the local reference operator frequency, for example by applying a suitable control voltage to a voltage-controlled oscillator.

At the same time, a temperature sensor 810 continuously monitors the VCO temperature, and provides a temperature signal that is input, along with the error control information to step 812, in which the corresponding temperature and control signal values are recorded in a table 814. Control then passes back to the decision step 804.

If the external reference 802 is not available, control passes instead to steps 816 and 818. At step 816, the current temperature is determined from the output of the temperature sensor 810, and a corresponding pre-recorded control signal value is retrieved from the table 814. At step 818, the retrieved control signal value is applied to the VCO. Control then returns to the decision step 804.

While the present invention has been described with respect to specific embodiments, it will be appreciated that various modifications and changes could be made without departing from the scope of the invention.

The claims defining the invention are as follows:

1. A method for use in a repeater, for controlling gain of a plurality of distinct frequency channels, comprising the steps of:
    translating the distinct frequency channels from an input radio frequency (RF) band to a first intermediate frequency (IF) band;
    converting the IF band into a corresponding digital signal comprising all of the distinct frequency channels;
    processing the digital signal to select a set of wanted channels from the distinct frequency channels;
    converting said set of wanted channels into corresponding analogue signals within a second IF band; and
    translating the analogue signals in the second IF band to an output RF band,
    wherein the method further comprises, for each channel in the set of wanted channels:
        monitoring a power level of an output channel;
        comparing the monitored power level with a predetermined maximum output signal level; and
        applying attenuation to the output channel to maintain the output channel power level at or below the maximum output signal level.

2. The method of claim 1, wherein the first IF band comprises the same frequency range as the second IF band.

3. The method of claim 1, further comprising, for each wanted channel of said digital signal:
    monitoring a digital signal level to be input to a digital-to-analogue converter having a maximum rated output signal level;
    comparing the monitored digital signal level with a value corresponding with the maximum rated output signal level for said digital-to-analogue converter; and
    digitally controlling a gain of said channel to maintain the digital signal level to be input to said digital-to-analogue converter at or below the value corresponding with the maximum rated output signal level for said digital-to-analogue converter.

4. The method of claim 1, further comprising:
    monitoring an IF power level of the IF band;
    comparing said monitored IF power level with a predetermined threshold level; and
    applying attenuation to the IF band to maintain the IF power level at or below the predetermined threshold level.

5. The method of claim 1 further including steps for maintaining frequency stability of a reference oscillator used in the implementation of the gain control, comprising:
    providing a stable external frequency reference source having at least intermittent availability;
    continuously monitoring a current temperature of the reference oscillator;
    while the stable external frequency reference source is available, applying a primary frequency control signal such that an output of the reference oscillator is synchronised to the external frequency reference, and recording a corresponding control signal value in association with the current temperature of the reference oscillator; and
    in the event that the stable external frequency reference source is unavailable, applying a secondary frequency control signal to the reference oscillator corresponding with the control signal value previously recorded in association with the current temperature of the reference oscillator.

6. The method of claim 5 wherein the stable external frequency reference source is a Global Positioning System (GPS) reference signal.

7. A method, for use in a repeater, for maintaining frequency stability of a reference oscillator subject to temperature variation, the method comprising:
    providing a stable external frequency reference source having at least intermittent availability;
    continuously monitoring a current temperature of the reference oscillator;
    while the stable external frequency reference source is available, applying a primary frequency control signal such that an output of the reference oscillator is synchronised to the stable external frequency reference source, and recording a corresponding control signal value in association with the current temperature of the reference oscillator; and
    in the event that the stable external frequency reference source is unavailable, applying a secondary frequency control signal to the reference oscillator corresponding with the control signal value previously recorded in association with the current temperature of the reference oscillator.

8. The method of claim 7 wherein the stable external frequency reference source is a GPS reference signal.

9. A radio repeater for amplification of a plurality of distinct frequency channels, and configured to control channel gain, comprising:
    a front-end subsystem including a mixer arranged to translate the distinct frequency channels from an input radio frequency (RF) band to a first intermediate (IF) band;
    a digital signal processing sub-section including at least one analogue-to-digital converter (ADC) for converting the IF band into a corresponding digital signal comprising all of the distinct frequency channels, the digital signal processing sub-section being configured to process the digital signal to select a set of wanted channels from the distinct frequency channels, and further including a digital-to-analogue converter (DAC) to convert said set of wanted channels into corresponding analogue signals within a second IF band; and a back-end subsystem including a plurality of mixers arranged to translate the analogue signals in the second IF band to an output RF band, wherein the back-end subsystem further comprises, for each channel in the set of wanted channels:
  a coupler arranged to provide a monitor signal corresponding with a power level of an output channel;
  a feedback loop arranged to receive said monitor signal, and including a power control circuit for comparing the power level with a predetermined maximum output signal level, and to generate a corresponding control signal; and
  a variable attenuator arranged to receive the control signal, and to apply attenuation to the output channel in order to maintain the output channel power level at or below the maximum output signal level.

10. The radio repeater of claim 9 wherein the first IF band comprises the same frequency range as the second IF band.

11. The radio repeater of claim 9 wherein the digital signal processing sub-section is further configured to process each wanted channel of the digital signal so as to:
  monitor a digital signal level to be input to the DAC corresponding with the channel, the DAC having a maximum rated output signal level;
  compare the monitored digital signal level with a value corresponding with the maximum rated output signal level for the DAC; and
  multiply the channel digital signal values by a gain determined in order to maintain the digital signal level to be input to the DAC at or below the value corresponding with the maximum rated output signal level for the DAC.

12. The radio repeater of claim 9 wherein:
  the front-end subsystem includes a variable gain attenuator having an attenuator control input; and
  the digital signal processing sub-section is configured to include an output sampler for sampling the output of the ADC, and to generate a corresponding attenuator control signal, the attenuator control signal being applied to the attenuator control input of the variable gain attenuator, and the attenuator control signal value being computed by comparing ADC output values with a predetermined threshold level, and determining corresponding attenuator control values that will maintain an IF power level corresponding with the ADC output at or below the predetermined threshold level.

13. The radio repeater of claim 9 further including a frequency stabilised reference generator which comprises:
  a receiver configured to receive an external frequency reference source signal having at least intermittent availability;
  a voltage-controlled oscillator (VCO) having a nominal frequency corresponding with a desired reference frequency, and a control voltage input;
  a correlator, configured to compare an external frequency reference derived from the external frequency reference source signal with corresponding samples of the VCO output frequency, and to generate an error-correction signal corresponding with a difference frequency;
  a temperature sensor, environmentally coupled to the VCO in order to measure VCO temperature;
  a memory device, configured to record error-correction signal values in association with corresponding temperature values detected by the temperature sensor; and
  a controller having a control signal output coupled to the VCO control voltage input, the controller being configured to:
    while the external frequency reference source signal is available, generating a control signal determined such that an output of the VCO is synchronised to the external frequency reference source signal, such that the error-correction signal is substantially zero; and
    in the event that the external frequency reference source signal is unavailable, retrieving from the memory device a previously recorded error-correction signal value corresponding with a current temperature detected by the temperature sensor.

14. The radio repeater of claim 13 wherein the frequency reference receiver is a Global Positioning System (GPS) receiver.

15. A frequency reference generator comprising:
  a receiver configured to receive an external frequency reference source signal having at least intermittent availability;
  a voltage-controlled oscillator (VCO) having a nominal frequency corresponding with a desired reference frequency, and a control voltage input;
  a correlator, configured to compare an external frequency reference derived from the external frequency reference source signal with corresponding samples of the VCO output frequency, and to generate an error-correction signal corresponding with a different frequency;
  a temperature sensor, environmentally coupled to the VCO in order to measure VCO temperature;
  a memory device, configured to record error-correction signal values in association with corresponding temperature values detected by the temperature sensor; and
  a controller having a control signal output coupled to the VCO control voltage input, the controller being configured to:
    while the external frequency reference source signal is available, generating a control signal determined such that an output of the VCO is synchronised to the external frequency reference source signal, such that the error-correction signal is substantially zero; and
    in the event that the external frequency reference source signal is unavailable, retrieving from the memory device a previously recorded error-correction signal value corresponding with a current temperature detected by the temperature sensor.

* * * * *